(12) United States Patent
Chua et al.

(10) Patent No.: US 10,559,708 B2
(45) Date of Patent: Feb. 11, 2020

(54) PROXIMITY SENSING MODULE WITH DUAL TRANSMITTERS

(71) Applicant: LITE-ON SINGAPORE PTE. LTD., Midview (SG)

(72) Inventors: Seng-Yee Chua, Singapore (SG); Guang-Li Song, Singapore (SG); Tong-Tee Tan, Singapore (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 16/105,450

(22) Filed: Aug. 20, 2018

(65) Prior Publication Data
US 2019/0341518 A1  Nov. 7, 2019

(30) Foreign Application Priority Data

May 7, 2018 (CN) .......................... 2018 1 0428452

(51) Int. Cl.
*H01L 31/173* (2006.01)
*H01L 31/0232* (2014.01)
*H01L 31/12* (2006.01)

(52) U.S. Cl.
CPC ...... *H01L 31/173* (2013.01); *H01L 31/02325* (2013.01); *H01L 31/125* (2013.01)

(58) Field of Classification Search
None
See application file for complete search history.

(56) References Cited

U.S. PATENT DOCUMENTS

| 8,675,706 B2* | 3/2014 | Seurin | H01S 5/4018 372/50.124 |
| 9,223,407 B2* | 12/2015 | Hsu | H04N 5/04 |
| 2011/0004327 A1* | 1/2011 | Bonnat | G06F 3/011 700/83 |
| 2014/0002410 A1* | 1/2014 | Lillie | G06F 3/041 345/174 |
| 2016/0239093 A1* | 8/2016 | Chua | G06F 3/017 |

* cited by examiner

*Primary Examiner* — Bilkis Jahan
(74) *Attorney, Agent, or Firm* — Li & Cai Intellectual Property (USA) Office

(57) ABSTRACT

A proximity sensing module with dual transmitters includes a circuit board, a package housing, a transmitter unit and a sensing assembly. The transmitter unit includes a first transmitter and a second transmitter. The first transmitter and the second transmitter are disposed on the circuit board. The sensing assembly includes a sensor disposed on the circuit board. The transmitter unit is shielded from the sensing assembly through the package housing. One of the first transmitter and the second transmitter is nearer to the sensing assembly than the other one is.

5 Claims, 3 Drawing Sheets

PROXIMITY SENSING MODULE WITH DUAL TRANSMITTERS

CROSS-REFERENCE TO RELATED PATENT APPLICATION

This application claims the benefit of priority to China Patent Application No. 201810428452.8, filed on May 7, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

FIELD OF THE PRESENT DISCLOSURE

The present disclosure relates to a proximity sensing module, and more particularly to a proximity sensing module with dual transmitters.

BACKGROUND OF THE PRESENT DISCLOSURE

A conventional mobile device often has a proximity sensor set in the display screen to detect a user's face, ears or hair, and temporarily deactivate the display screen when a close range object is detected, thereby on the one hand saving power, and on the other hand preventing the user's face and ear from accidentally touching the screen during a call and affecting the ongoing call.

For aesthetic appeal, proximity sensor apertures arranged on the mobile device are getting smaller to satisfy market demands. However, a smaller proximity sensor aperture compromises signal transmission efficiency of the transmitter inside the proximity sensor, and when the signal is not successfully transmitted out of the mobile device but reflected by the mobile device, leads to an increased crosstalk effect.

In addition, a conventional mobile device often uses a glass panel with a coated surface as a display screen, for which different color coatings or functional coatings can be selected according to user needs. However, coated glass panels have higher light transmittance and light reflectivity than uncoated glass panels or opaque panels, and therefore are associated with a stronger crosstalk effect. Such a crosstalk effect reduces the signal-to-noise ratio measured by proximity sensors, leading to inability of effectively sensing objects in proximity.

SUMMARY OF THE PRESENT DISCLOSURE

In response to the above-referenced technical inadequacies, the present disclosure provides a proximity sensing module with dual transmitters (an approach transducer). A transmitter unit and a sensing assembly are disposed in the package housing and are shielded from each other. One of the two transmitters is nearer to a sensor than the other is, so that the proximity sensing module with dual transmitters can still sense near-distance objects in an environment abound with crosstalk.

In one aspect, the present disclosure provides a proximity sensing module with dual transmitters. The proximity sensing module includes a circuit board, a package housing, a transmitter unit and a sensing assembly. The package housing is disposed on the circuit board, and has a first package structure, a second package structure, a first partition structure, a second partition structure, a first accommodating space defined by the first package structure and the first partition structure, a second accommodating space defined by the first partition structure and the second partition structure, and a third accommodating space defined by the second partition structure and the second package structure. The transmitter unit includes a first transmitter disposed on the circuit board and in the first accommodating space, and a second transmitter disposed on the circuit board and in the second accommodating space. The sensing assembly is disposed on the circuit board and in the second accommodating space. The sensing assembly includes a first driver, a second driver and a sensor. The first driver is electrically connected with the first transmitter through the circuit board and configured to drive the first transmitter to transmit a first signal. The second driver is electrically connected with the first transmitter through the circuit board and configured to drive the second transmitter to transmit a second signal. The sensor is electrically connected with the first driver and the second driver. The sensor is configured to receive a first reflection signal formed by the first signal being reflected by a farther-distance object and a second reflection signal formed by the second signal being reflected by a near-distance object.

In certain embodiments, the sensor receives the first reflection signal and the second reflection signal at different times.

In certain embodiments, the proximity sensing module with dual transmitters further includes a light shielding member disposed on the first partition structure and configured to limit a first signal transmission range of the first transmitter.

In certain embodiments, the first transmitter and the second transmitter are of different types of light transmitters.

In certain embodiments, the first transmitter is a surface-emitting laser device.

In one aspect, the present disclosure provides another proximity sensing module with dual transmitters. The proximity sensing module has a circuit board, a package housing, a transmitter unit and a sensing assembly. The package housing has a first package structure, a second package structure, a partition structure, a first accommodating space defined by the first package structure and the partition structure, and a second accommodating space defined by the partition structure and the second package structure. The transmitter unit includes a first transmitter and a second transmitter both disposed on the circuit board and in the first accommodating space. The first transmitter is nearer to the partition structure than the second transmitter is. The sensing assembly is disposed on the circuit board and in the second accommodating space. The sensing assembly includes a first driver, a second driver and a sensor. The first driver is electrically connected with the first transmitter through the circuit board and configured to drive the first transmitter to transmit a first signal. The second driver is electrically connected with the first transmitter through the circuit board and configured to drive the second transmitter to transmit a second signal. The sensor is electrically connected with the first driver and the second driver. The sensor is configured to receive a first reflection signal formed by the first signal being reflected by a farther-distance object and a second reflection signal formed by the second signal being reflected by a near-distance object.

In certain embodiments, the sensor receives the first reflection signal and the second reflection signal at different times.

In certain embodiments, the proximity sensing module with dual transmitters further includes a light shielding member disposed on the partition structure and configured to limit a first signal transmission range of the first transmitter.

In certain embodiments, the proximity sensing module with dual transmitters further includes an optical path correction component disposed in the first accommodating space. The optical path correction component is configured to deviate a first signal transmission range of the first transmitter away from the sensing assembly, and deviate a second signal transmission range of the second transmitter towards the sensing assembly.

In one aspect, the present disclosure provides yet another proximity sensing module with dual transmitters. The proximity sensing module includes a circuit board, a package housing, a sensing assembly and a transmitter unit. The including sensing assembly includes a sensor disposed on the circuit board. The transmitter unit is shielded from the sensing assembly through the package housing. The transmitter unit includes a first transmitter and a second transmitter both disposed on the circuit board. One of the first transmitter and the second transmitter is nearer to the sensing assembly than the other one is.

Therefore, through the technical features of "the transmitter unit and the sensing assembly being shielded from each other through the package housing" and "one of the first transmitter and the second transmitter being nearer to the sensing assembly than the other one is," the proximity sensing module with dual transmitters provided by the present disclosure allows a first signal to be reflected by a farther-distance object to form a first reflection signal, a second signal to be reflected by a near-distance object to form a second reflection signal, and allows a sensor to be used to receive the first reflection signal and the second reflection signal.

These and other aspects of the present disclosure will become apparent from the following description of the embodiment taken in conjunction with the following drawings and their captions, although variations and modifications therein may be affected without departing from the spirit and scope of the novel concepts of the present disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
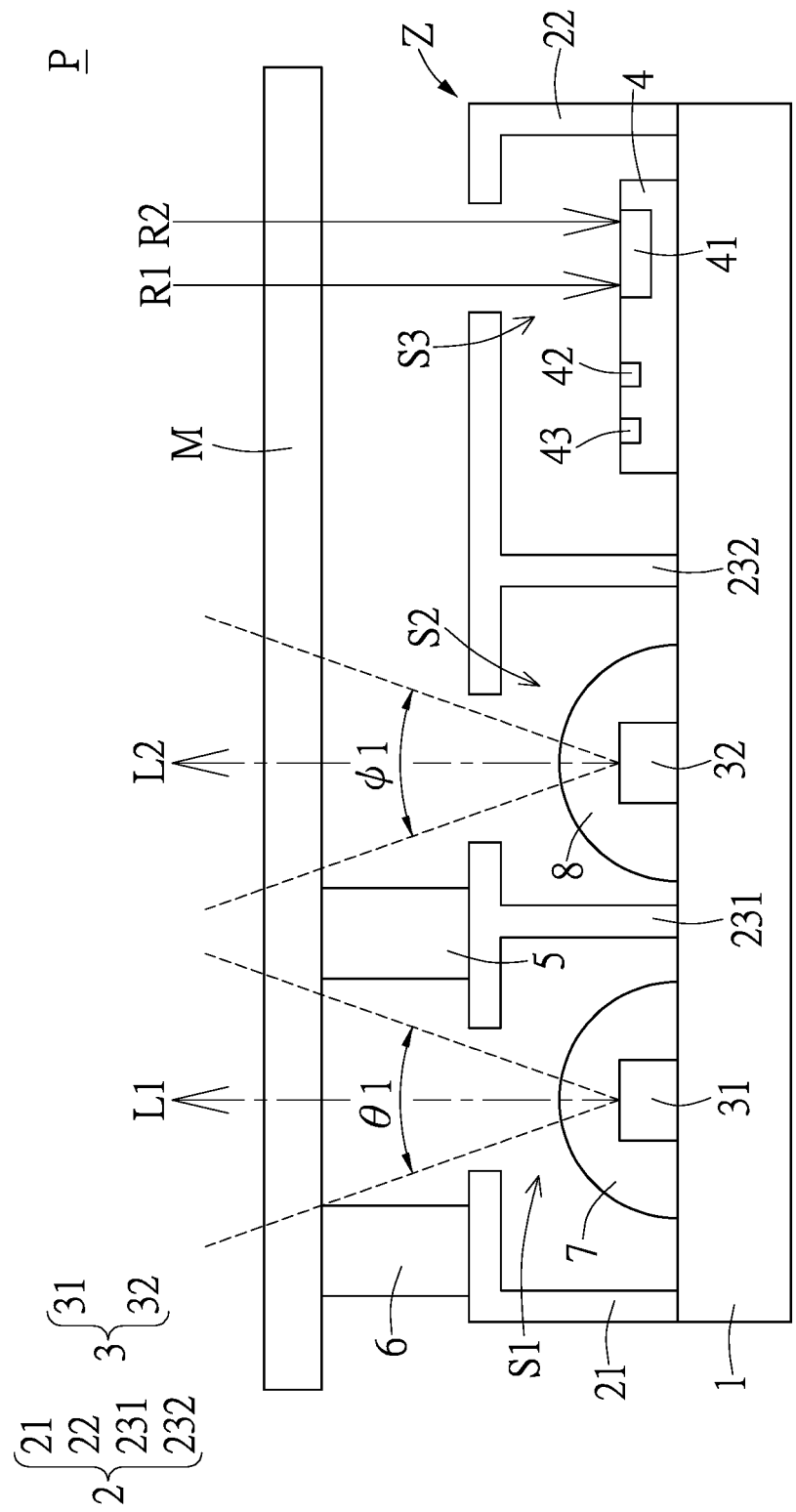
FIG. 1 is a cross-sectional view of a portable device applied with a proximity sensing module with dual transmitters according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which shows a schematic cross-sectional view of a portable device P having a proximity sensing module Z with dual transmitters according to a first embodiment of the present disclosure. The proximity sensing module Z is disposed on an inner side of a panel M of the portable device P. The proximity sensing module Z includes a circuit board 1, a package housing 2, a transmitter unit 3, and a sensing assembly 4. In the present embodiment, the panel M of the mobile device P applied with the proximity sensing module Z of the present disclosure is a glass panel having a surface coating. However, the present disclosure is not limited thereto.

Further, the package housing 2 is disposed on the circuit board 1. The package housing 2 includes a first package structure 21, a second package structure 22, a first partition structure 231, a second partition structure 232, a first accommodating space S1 defined by the first package structure 21 and the first partitioning structure 231, a second accommodating space S2 defined by the first partitioning structure 231 and the second partitioning structure 232, and a third accommodation space S3 defined by the second partition structure 232 and the second package structure 22.

As shown in FIG. 1, the transmitter unit 3 includes a first transmitter 31 and a second transmitter 32. The first transmitter 31 and the second transmitter 32 are disposed on the circuit board 1, and are located in the first accommodation space S1 and the second accommodation space S2, respectively. Further, the sensing assembly 4 is disposed in the third accommodating space S3 and on the circuit board 1. The sensing assembly 4 includes a sensor 41, a first driver 42 electrically connected to the sensor 41, and a second driver 43 electrically connected to the sensor 41. The first driver 42 is electrically connected to the first transmitter 31 through the circuit board 1, and the second driver 43 is electrically connected to the second transmitter 32 through the circuit board 1.

Further, the first driver 42 is configured to drive the first transmitter 31 to transmit a first signal L1. The first signal L1 is reflected by an object to be measured that is far from the proximity sensing module Z (hereinafter, "far object") to form a first reflection signal R1. The second driver 43 is configured to drive the second transmitter 32 to transmit a second signal L2. The second signal L2 is reflected by an object to be measured that is near the proximity sensing module Z (hereinafter, "near object") to form a second reflection signal R2. The sensor 41 is configured to receive the first reflection signal R1 and the second reflection signal R2.

Specifically, in the present embodiment, the proximity sensing module Z further includes a light shielding member 5. The first transmitter 31 has a first signal transmission range $\theta 1$, and the second transmitter 32 has a second signal transmission range $\phi 1$. The light shielding member 5 is disposed on the first partition structure 231 to limit the first signal transmission range $\theta 1$ of the first transmitter 31. □In addition, the first transmitter 31 and the second transmitter 32 can be of different kinds of light transmitters. In the present embodiment, the first transmitter 31 is a vertical-cavity surface-emitting laser (VCSEL), and the second transmitter 32 is an infrared light emitting diode.

Through the above structure, the first transmitter 31 is farther away from the sensor 41 than the second transmitter 32 is, and the light shielding element 5 prevents the first signal L1 emitted by the first transmitter 31 from being reflected by the panel M to the sensor 41. Therefore, the first driver 42 drives the first transmitter 31 to transmit the first signal L1 to the far object, and the sensor 41 receives the first reflection signal R1 reflected by the far object. The second driver 43 drives the second transmitter 32 to transmit the second signal L2 to the near object, and the sensor 41 receives the second reflection signal R2 reflected by the near object and crosstalk signals generated by the panel reflecting the second signal L2. Thereby, in the proximity sensing module Z of the present disclosure, the first transmitter 31 is configured to sense a far object, and the second transmitter 32 is used to sense a near object.

Further, through the above structure, the first transmitter 31 of the present embodiment can selectively be a surface-emitting laser (device), so that the energy of the first signal L1 is sufficient to allow the first signal L1 to be transmitted to the far object. The second transmitter 32 can selectively be an infrared light emitting diode. As the second transmitter 32 is used for measuring (calibrating) a near object, the second signal L2 does not need to be transmitted to a distant location. Therefore, the use of the infrared light emitting diode for the second transmitter 32 not only saves energy, but also achieves the purpose of measuring. Thereby, the proximity sensing module Z of the present disclosure enjoys the advantage of flexible transmitter type selection. More specifically, the present disclosure is not limited to the above. The first transmitter 31 can be an emitter that emits a photon beam with stronger energy, so that the sensor 41 receives a stronger first reflected signal R1, and the second transmitter 32 can be an emitter that emits a photon beam with weaker energy, so as to save power and not to affect the measurement of an object in proximity.

Further, in the present embodiment, the first driver 42 drives the first transmitter 31 at a time different from that of the second driver 43 driving the second transmitter 32, so as to obtain farther-distance proximity sensing data and near-distance proximity sensing data. Specifically, when the first transmitter 31 is in an on state, the second transmitter 32 is in an off state. When the first transmitter 31 is in an off state, the second transmitter is in an on state. The first transmitter 31 and the second transmitter 32 transmit signals when in the on state, and do not transmit signals when in an off state. However, the present disclosure is not limited to the above.

As shown in FIG. 1, the proximity sensing module Z of the present disclosure further includes a sidelight shielding member 6 for preventing the first signal L1 transmitted by the first transmitter 31 from leaking away between the panel M and the proximity sensing module Z. However, the present disclosure is not limited thereto. Further, when the panel M and the proximity sensing module Z are relatively narrowly spaced apart from each other, the proximity sensing module Z can be provided with no sidelight shielding member 6; and when the panel M and the proximity sensing module Z are less narrowly spaced apart from each other, the proximity sensing module Z can be provided with the sidelight shielding member 6 to prevent not only light leakage, but also the intrusion of external lights between the panel M and the proximity sensing module Z, thereby further reducing the crosstalk effect. In addition, the light shielding member 5 and the sidelight shielding member 6 can be made of at least one opaque material, and can be made of at least one stretchable material.

As shown in FIG. 1, the proximity sensing module Z of the present disclosure further includes a first lens 7 and a second lens 8. As shown in the figures, the first lens 7 is disposed in the first accommodating space S1 and disposed on the circuit board 1. The first lens 7 covers the first transmitter 31. The second lens 8 is disposed in the second accommodating space S2 and disposed on the circuit board 1. The second lens 8 covers the second transmitter 32. Through the first lens 7 and the second lens 8, the light emitting directions of the first transmitter 31 and the second transmitter 32 can be better controlled, the generation of crosstalk lights is reduced, and a better proximity-sensing effect is obtained.

In summary, the proximity sensing module Z of the first embodiment is configured with two transmitters, that is, the first transmitter 31 and the second transmitter 32. The second transmitter 32 is arranged to be near the sensor 41, and the first transmitter 31 is arranged to be less near the sensor 41. The first partition structure 231 located between the first transmitter 31 and the second transmitter 32 is used to substantially reduce the sensor 41's chance of receiving crosstalk lights. Through the above structure, the proximity sensing module Z according to the first embodiment of the present disclosure uses the first transmitter 31 to sense most of the far objects, and uses the second transmitter 32 to sense most of the near objects. The sensor 41 receives the first reflection signal R1 and the second reflection signal R2 generated by the reflection of the first signal L1 and the second signal L2 on the panel M, thereby increasing the sensing range of the proximity sensing module Z, reducing the probability of misjudgment, and achieving a smaller package size. Furthermore, due to the division of labor between the first transmitter 31 and the second transmitter 32, a suitable transmitter type can be selected for each of the first transmitter 31 and the second transmitter 32 depending on their respective functions.

Second Embodiment

Figure 2:
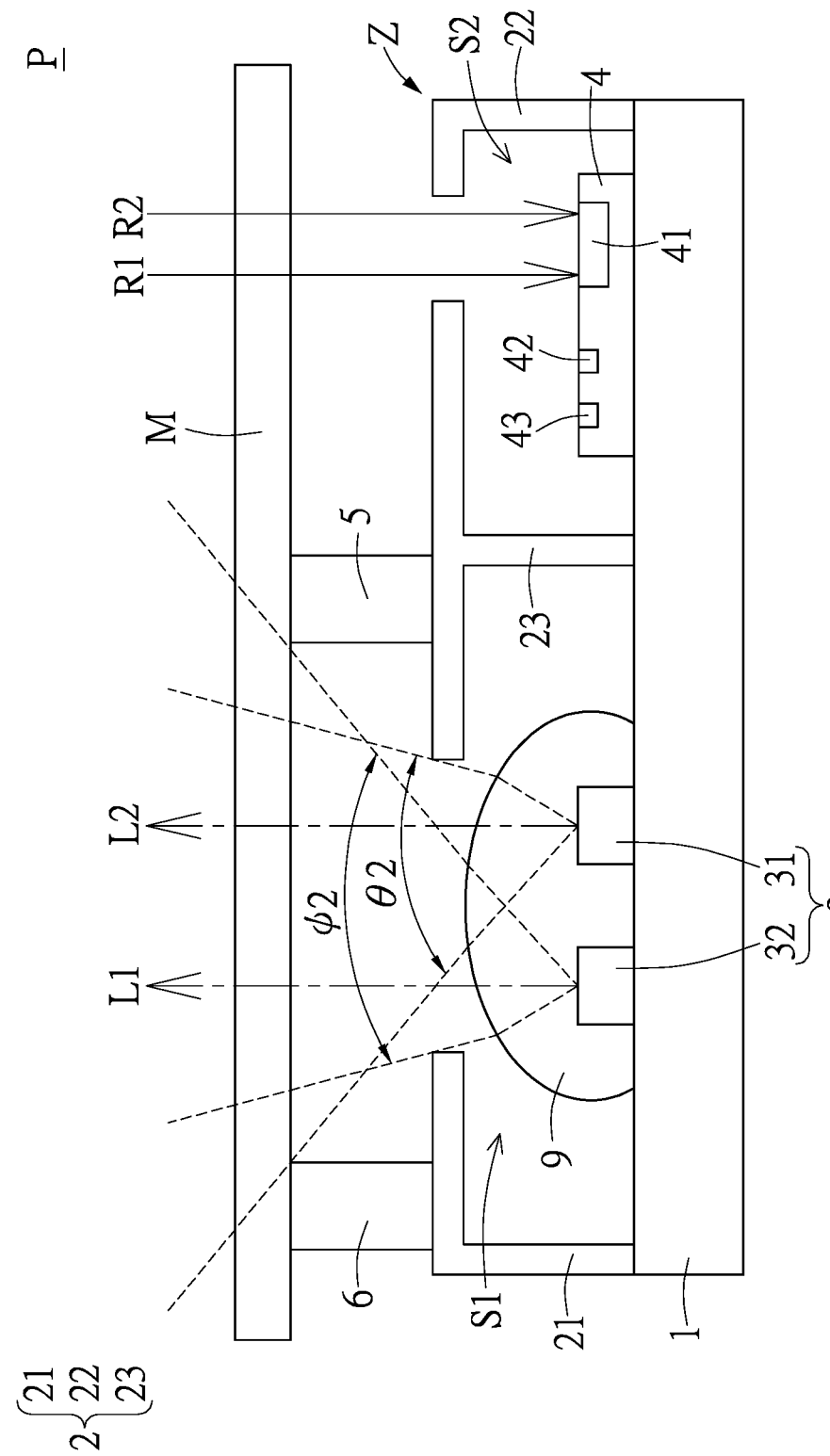
FIG. 2 is a cross-sectional view of a portable device applied with a proximity sensing module with dual transmitters according to a second embodiment of the present disclosure.

Reference is made to FIG. 2. Description for certain features in the second embodiment of the present disclosure that are substantially the same as those in the first embodiment are omitted herein for brevity. One of the differences between the second embodiment and the first embodiment is that in the second embodiment, the first transmitter 31 and the second transmitter 32 are in the same accommodating space of the package housing 2. Specifically, the package housing 2 of the proximity sensing module Z of the second embodiment includes a first package structure 21, a second package structure 22, a partition structure 23, a first accommodating space S1 defined by the first package structure 21 and the partition structure 23, and a second accommodating space S2 defined by the partition structure 23 and the second package structure 22. The first transmitter 31 and the second transmitter 32 are disposed on the circuit board 1 and located in the first accommodating space S1, and the sensing assembly 4 is disposed on the circuit board 1 and located in the second accommodating space S2.

Further, another difference between the second embodiment and the first embodiment is that in the first embodiment, the first transmitter 31 is farther away from the sensing assembly 4 than the second transmitter 32 is, while in the present embodiment, the first transmitter 31 is closer to the sensing assembly 4 than the second transmitter 32 is.

Specifically, in the present embodiment, since the first transmitter 31 is closer to the partition structure 23 than the second transmitter 32 is, and the partition structure 23 and the light shielding member 5 together shield the light transmitted from the first transmitter 31 and reflected by the panel M, the sensor 41 can receive the crosstalk lights of the second transmitter 32, and the probability of the first signal L1 emitted by the first transmitter 31 being reflected and becoming crosstalk lights is relatively small. In this embodiment, the first transmitter 31 is used to sense an object in proximity that is farther away, and the second transmitter 32 is used to sense an object that is in closer proximity.

Further, in the present embodiment, the proximity sensing module Z further includes an optical path correction component 9. As shown in FIG. 2, in the embodiment, the optical path correction component 9 is a lens that covers the first transmitter 31 and the second transmitter 32. The first transmitter 31 and the second transmitter 32 are respectively located on the both sides of the main axis of the light path correction component 9.

Further, as shown in FIG. 2, the first signal transmission range θ2 of the first transmitter 31 can be offset by the adjustment of the light path correction component 9 toward a direction away from the sensing component 4, and the second signal transmission range ϕ2 of the second transmitter 32 can be offset by the adjustment of the light path correction component 9 toward a direction approaching the sensing component 4. It should be noted that the present disclosure is not limited to the implementation manners of the optical path correction component 9 as described above. In other embodiments, the optical path modification component 9 can also be a component or structure other than a lens.

Through the adoption of the optical path correction component 9, the first signal transmission range θ2 of the first transmitter 31 deviates away from the sensing component 4, and therefore the crosstalk lights received by the sensing component 4 from the first transmitter 31 is reduced; and the second signal transmission range ϕ2 of the second transmitter 32 deviates toward the sensing component 4, thereby increasing the crosstalk effect produced by the light received by the sensor 41 from the second transmitter 32. Therefore, the first transmitter 31 is used to sense an object in farther-distance proximity, and the second transmitter 32 is used to sense an object in near-distance proximity. Compared with the scenario in which the proximity sensing module Z is not provided with the light path correction component 9, in the present embodiment, the first transmitter 31 and the second transmitter 32 achieve a better labor division effect.

Further, it can be known from the differences between and the effects achieved together by the first embodiment and the second embodiment that the present disclosure is not limited by whether the first transmitter 31 and the second transmitter are located in the same accommodating space. Rather, the scope of the present disclosure encompasses any configurations in which the transmitter unit 3 and the sensing assembly 4 are shielded from each other by the package housing 2, and one of the first transmitter 31 and the second transmitter 32 is closer to the sensing assembly than the other one is.

Figure 3:
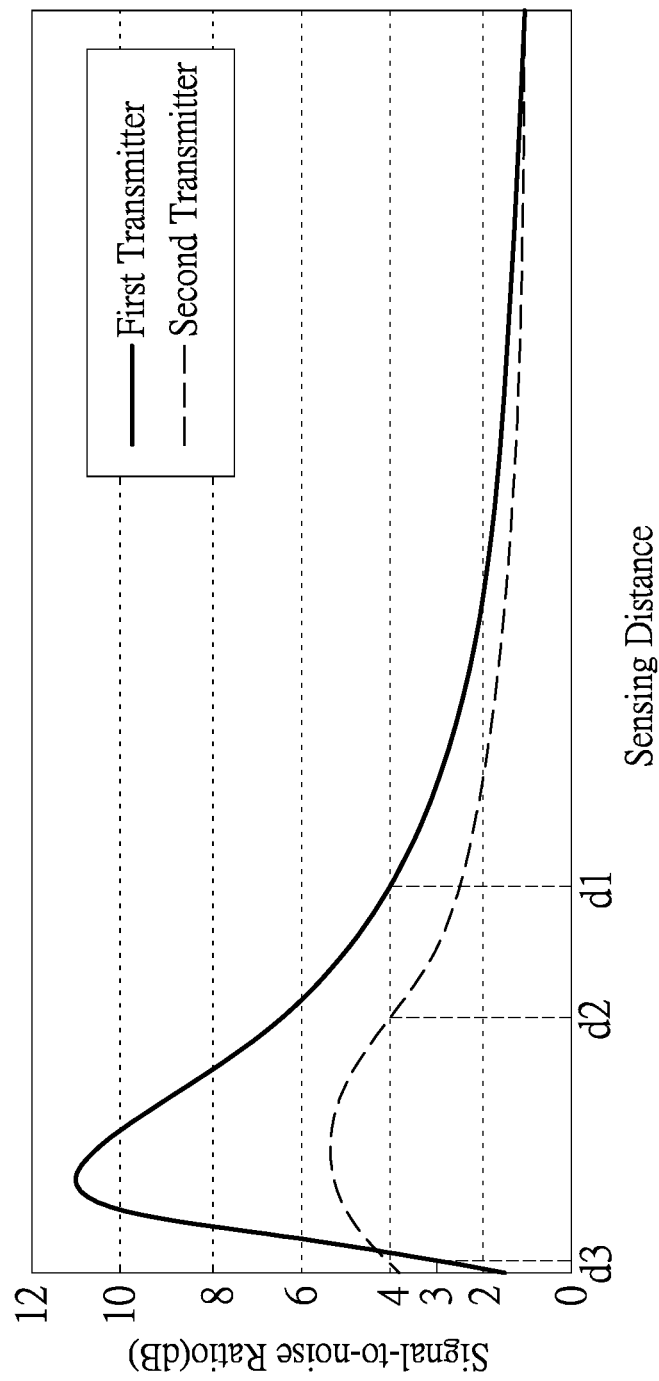
FIG. 3 is a schematic diagram of a signal-to-noise ratio of an operating proximity sensing module with dual transmitters according to the second embodiment of the present disclosure.

Reference is made to FIG. 3, which shows a schematic diagram of the signal-to-noise ratio of an operating proximity sensing module Z with dual transmitters in accordance with the second embodiment of the present disclosure. As shown in the figure, since the first transmitter 31 is used to sense a far object and the second transmitter 32 is used to sense a near object, when an object to be measured is located very close to the panel M, the second transmitter 32 has a higher signal-to-noise ratio than the first transmitter 31. As the distance between an object to be measured and the proximity sensing module Z increases, the signal-to-noise ratio of the second transmitter 32 decreases, and the signal-to-noise ratio of the first transmitter 31 increases. With respect to an object to be measured that is located farther away in the proximity sensing range of the proximity sensing module Z, the first transmitter 31 has a higher signal-to-noise ratio than the second transmitter 32.

Further, referring to FIG. 3, the sensor 41 can be configured with a near threshold and a far threshold. For example, the near threshold of the sensor 41 can be set to 4 dB, and the far threshold can be set to 3 dB. When the object to be measured approaches the panel M from far to near, both the reflection signals formed by the object reflecting the first signal L1 emitted by the first transmitter 31 when a distance between the object and the panel M is d1, and formed by the object reflecting the second signal L2 emitted by the second transmitter 32 when the distance is d2 satisfy the near threshold. The portable device P determines that the object has become substantially near the panel M according to the satisfaction of the near threshold. The portable device P then sets the panel M in a dormant mode. When the object continues to approach the panel M till the distance between the object and the panel M is d3, the signal-to-noise ratio of the reflection of the first signal L1 of the first transmitter 31 on the object decreases to 3 dB, so that the far threshold of the sensor 41 is satisfied with respect to the first transmitter 31. Nevertheless, since the reflection signal of the second transmitter 32 has a signal-to-noise ratio higher than 3 dB, the portable device P does not determine that enough distance has been put between the object and the panel M and therefore does not reactivate the screen. Accordingly, the proximity sensing module Z of the present disclosure can increase a proximity sensing range, improve the sensing ability for low reflectivity substances (for example, hairs), and reduce the probability of misjudgment.

In summary, in the present disclosure, the partition structure 23 shields the transmitter unit 3 from the sensing assembly 4 in the package structure 2; and one of the first transmitter 31 and the second transmitter 32 is arranged to be nearer to the partition structure 23, and the other one farther away from the partition structure 23, so that the one nearer to the partition structure 23, for example, the first transmitter 31, has a limited first signal transmission range θ1, leading to a lower probability of optical crosstalk generation for the first transmitter 31 and a higher probability of crosstalk light generation for the second transmitter 32. As a result, the first transmitter 31 can be used to sense an object in farther-distance proximity, and the second transmitter 32 can be used to sense an object in nearer-distance proximity. Accordingly, in the present disclosure, the transmitter unit 3 and the sensing assembly 4 need not be packaged separately, and the proximity sensing module Z has a smaller package volume, incurs lower costs, and enjoys flexible transmitter type selection for the first transmitter 31 and the second transmitter 32. Further, with the two transmitters respectively sensing objects in farther-distance proximity and objects in nearer-distance proximity, the proximity sensing module Z of the present disclosure has a larger proximity sensing range, improved sensing ability for low reflectivity substances, and a reduced probability of misjudgment.

Therefore, through technical features of "the transmitter unit 3 and the sensing assembly 4 being shielded from each other through the package housing 2" and "one of the first transmitter 31 and the second transmitter 32 being nearer to the sensing assembly 4 than the other one is," the proximity sensing module Z with dual transmitters provided by the present disclosure allows a first signal to be reflected by a far object to form a first reflection signal, a second signal to be reflected by a near object to form a second reflection signal, and allows a sensor to be used to receive the first reflection signal and the second reflection signal.

Therefore, with the two transmitters respectively sensing objects in farther-distance proximity and objects in nearer-distance proximity, the proximity sensing module Z of the present disclosure has a larger proximity sensing range, improved sensing ability for low reflectivity substances, and a reduced probability of misjudgment. Further, in the present disclosure, the transmitter unit 3 and the sensing assembly 4 need not be packaged separately, and the proximity sensing module Z has a smaller package volume, incurs lower costs and enjoys flexible transmitter type selection for the first transmitter 31 and the second transmitter 32.

The foregoing description of the exemplary embodiments of the present disclosure has been presented only for the purposes of illustration and description and is not intended to be exhaustive or to limit the present disclosure to the precise forms disclosed. Many modifications and variations are possible in light of the above teaching.

The embodiments were chosen and described in order to explain the principles of the present disclosure and their practical application so as to enable others skilled in the art to utilize the present disclosure and various embodiments and with various modifications as are suited to the particular use contemplated. Alternative embodiments will become apparent to those skilled in the art to which the present disclosure pertains without departing from its spirit and scope.

What is claimed is:

1. A proximity sensing module with dual transmitters, comprising:
    a circuit board;
    a package housing disposed on the circuit board and having:
        a first package structure;
        a second package structure;
        a first partition structure;
        a second partition structure;
        a first accommodating space defined by the first package structure and the first partition structure;
        a second accommodating space defined by the first partition structure and the second partition structure; and
        a third accommodating space defined by the second partition structure and the second package structure;
    a transmitter unit including:
        a first transmitter disposed on the circuit board and in the first accommodating space; and
        a second transmitter disposed on the circuit board and in the second accommodating space; and
    a sensing assembly disposed on the circuit board and in the third accommodating space and including:
        a first driver electrically connected with the first transmitter through the circuit board and configured to drive the first transmitter to transmit a first signal;
        a second driver electrically connected with the second transmitter through the circuit board and configured to drive the second transmitter to transmit a second signal; and
        a sensor electrically connected with the first driver and the second driver and configured to receive a first reflection signal formed by the first signal being reflected by a farther-distance object and a second reflection signal formed by the second signal being reflected by a near-distance object.

2. The proximity sensing module with dual transmitters according to claim 1, wherein the sensor receives the first reflection signal and the second reflection signal at different times.

3. The proximity sensing module with dual transmitters according to claim 1, further comprising a light shielding member disposed on the first partition structure and configured to limit a first signal transmission range of the first transmitter.

4. The proximity sensing module with dual transmitters according to claim 1, wherein the first transmitter and the second transmitter are of different types of light transmitters.

5. The proximity sensing module with dual transmitters according to claim 4, wherein the first transmitter is a surface-emitting laser device.

\* \* \* \* \*